United States Patent
Linford et al.

(10) Patent No.: US 9,346,149 B1
(45) Date of Patent: May 24, 2016

(54) POLYCRYSTALLINE DIAMOND COMPACTS AND APPLICATIONS THEREFOR

(71) Applicant: US Synthetic Corporation, Orem, UT (US)

(72) Inventors: Brandon Paul Linford, Draper, UT (US); Cody William Knuteson, Salem, UT (US)

(73) Assignee: US SYNTHETIC CORPORATION, Orem, UT (US)

( * ) Notice: Subject to any disclaimer, the term of this patent is extended or adjusted under 35 U.S.C. 154(b) by 514 days.

(21) Appl. No.: 13/734,354

(22) Filed: Jan. 4, 2013

(51) Int. Cl.
   *E21B 10/567* (2006.01)
   *B24D 3/10* (2006.01)

(52) U.S. Cl.
   CPC ............... *B24D 3/10* (2013.01); *E21B 10/567* (2013.01)

(58) Field of Classification Search
   CPC ........ E21B 10/46; E21B 10/56; E21B 10/567
   See application file for complete search history.

(56) References Cited

U.S. PATENT DOCUMENTS

| | | | |
|---|---|---|---|
| 5,584,045 A * | 12/1996 | Tanabe et al. | 428/547 |
| 6,338,754 B1 | 1/2002 | Cannon et al. | |
| 7,866,418 B2 | 1/2011 | Bertagnolli et al. | |
| 8,071,173 B1 * | 12/2011 | Sani | 427/337 |
| 8,236,074 B1 | 8/2012 | Bertagnolli et al. | |
| 8,663,349 B2 | 3/2014 | Sani et al. | |
| 2004/0238227 A1 * | 12/2004 | Smith et al. | 175/431 |
| 2011/0226532 A1 * | 9/2011 | Jonker et al. | 175/57 |
| 2011/0259648 A1 * | 10/2011 | Sani | 175/428 |
| 2012/0152622 A1 * | 6/2012 | Sue et al. | 175/428 |

OTHER PUBLICATIONS

G. Rousse, S. Klotz, A. M. Saitta, J. Rodriguez-Carvajal, M. I. McMahon, B. Couzinet, and M. Mezouar, "Structure of the Intermediate Phase of PbTe at High Pressure," Physical Review B: Condensed Matter and Materials Physics, 71, 224116 (2005).
D. L. Decker, W. A. Bassett, L. Merrill, H. T. Hall, and J. D. Barnett, "High-Pressure Calibration: A Critical Review," J. Phys. Chem. Ref. Data, 1, 3 (1972).
U.S. Appl. No. 12/608,155, filed Oct. 29, 2009, Sani et al.
U.S. Appl. No. 13/324,237, filed Dec. 13, 2011, Kidd et al.
U.S. Appl. No. 61/846,138, filed Jul. 15, 2013, Bertagnolli et al.
U.S. Appl. No. 61/948,970, filed Mar. 6, 2014, Knuteson et al.
U.S. Appl. No. 62/002,001, filed May 22, 2014, Knuteson et al.
U.S. Appl. No. 62/062,553, filed Oct. 10, 2014, Heaton et al.
U.S. Appl. No. 62/096,315, filed Dec. 23, 2014, Heaton et al.

(Continued)

*Primary Examiner* — Brad Harcourt
(74) *Attorney, Agent, or Firm* — Dorsey & Whitney LLP

(57) ABSTRACT

Embodiments relate to polycrystalline diamond compacts ("PDCs") including a polycrystalline diamond ("PCD") table having a diamond grain size distribution selected for improving leachability. In an embodiment, a PDC includes a PCD table bonded to a substrate. The PCD table includes diamond grains exhibiting diamond-to-diamond bonding therebetween. The diamond grains includes a first amount being about 30 to about 65 volume % of the diamond grains and a second amount being about 18 to about 65 volume % of the diamond grains. The first amount exhibits a first average grain size of about 8 μm to about 22 μm. The second amount exhibits a second average grain size that is greater than the first average grain size and is about 15 μm to about 50 μm. Other embodiments are directed methods of forming PDCs, and various applications for such PDCs in rotary drill bits, bearing apparatuses, and wire-drawing dies.

19 Claims, 10 Drawing Sheets

(56) References Cited

OTHER PUBLICATIONS

U.S. Appl. No. 14/329,552, filed Jul. 11, 2014, Bertagnolli et al.
U.S. Appl. No. 14/627,966, filed Feb. 20, 2015, Linford et al.

ASTM B886-03 (2008) "Standard Test Method for Determination of Magnetic Saturation (Ms) of Cemented Carbides".
ASTM B887-03 (2008) "Standard Test Method for Determination of Coercivity (Hcs) of Cemented Carbides".

* cited by examiner

_US 9,346,149 B1_

POLYCRYSTALLINE DIAMOND COMPACTS AND APPLICATIONS THEREFOR

BACKGROUND

Wear-resistant, superabrasive compacts are utilized in a variety of mechanical applications. For example, polycrystalline diamond compacts ("PDCs") are used in drilling tools (e.g., cutting elements, gage trimmers, etc.), machining equipment, bearing apparatuses, wire-drawing machinery, and in other mechanical apparatuses.

PDCs have found particular utility as superabrasive cutting elements in rotary drill bits, such as roller cone drill bits and fixed cutter drill bits. A PDC cutting element typically includes a superabrasive diamond layer commonly referred to as a diamond table. The diamond table may be formed and bonded to a substrate using a high-pressure, high-temperature ("HPHT") process. The PDC cutting element may also be brazed directly into a preformed pocket, socket, or other receptacle formed in the bit body. The substrate may often be brazed or otherwise joined to an attachment member, such as a cylindrical backing. A rotary drill bit typically includes a number of PDC cutting elements affixed to the bit body. It is also known that a stud carrying the PDC may be used as a PDC cutting element when mounted to a bit body of a rotary drill bit by press-fitting, brazing, or otherwise securing the stud into a receptacle formed in the bit body.

Conventional PDCs are normally fabricated by placing a cemented carbide substrate into a container with a volume of diamond particles positioned adjacent to the cemented carbide substrate. A number of such containers may be loaded into an HPHT press. The substrate and volume of diamond particles are then processed under HPHT conditions in the presence of a catalyst that causes the diamond particles to bond to one another to form a matrix of bonded diamond grains defining a polycrystalline diamond ("PCD") table that is bonded to the substrate. The catalyst is often a metal-solvent catalyst (e.g., cobalt, nickel, iron, or alloys thereof) that is used for promoting intergrowth of the diamond particles.

In one conventional approach, a constituent of the cemented carbide substrate, such as cobalt from a cobalt-cemented tungsten carbide substrate, liquefies and sweeps from a region adjacent to the volume of diamond particles into interstitial regions between the diamond particles during the HPHT process. The cobalt acts as a catalyst to promote intergrowth between the diamond particles, which results in formation of bonded diamond grains.

Despite the availability of a number of different PCD materials, manufacturers and users of PCD materials continue to seek improved PCD materials.

SUMMARY

Embodiments of the invention relate to a PDC including a PCD table having a diamond grain size distribution selected for enhanced leachability. In an embodiment, a PDC includes a PCD table bonded to a substrate. The PCD table includes a plurality of diamond grains exhibiting diamond-to-diamond bonding therebetween. The plurality of diamond grains includes a first amount being about 30 volume % to about 65 volume % of the plurality of diamond grains and a second amount being about 18 volume % to about 65 volume % of the plurality of diamond grains. The first amount of the plurality of diamond grains exhibits a first average grain size of about 8 μm to about 22 μm. The second amount of the plurality of diamond grains exhibits a second average grain size that is greater than the first average grain size and is about 15 μm to about 50 μm.

In an embodiment, a method of fabricating a PDC includes enclosing a plurality of diamond particles in a pressure transmitting medium to form a cell assembly. The plurality of diamond particles includes a first amount being about 30 weight % to about 65 weight % of the plurality of diamond particles that exhibits a first average grain size of about 8 μm to about 22 μm and a second amount being about 18 weight % to about 65 weight % of the plurality of diamond particles that exhibits a second average grain size of about 15 μm to about 50 μm. The second average particle size is greater than the first average particle size. The method further includes subjecting the cell assembly to a high-pressure/high-temperature process to form a polycrystalline diamond body.

Further embodiments relate to applications utilizing the disclosed PDCs in various articles and apparatuses, such as rotary drill bits, bearing apparatuses, wire-drawing dies, machining equipment, and other articles and apparatuses.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings.

DETAILED DESCRIPTION

Figure 1A:
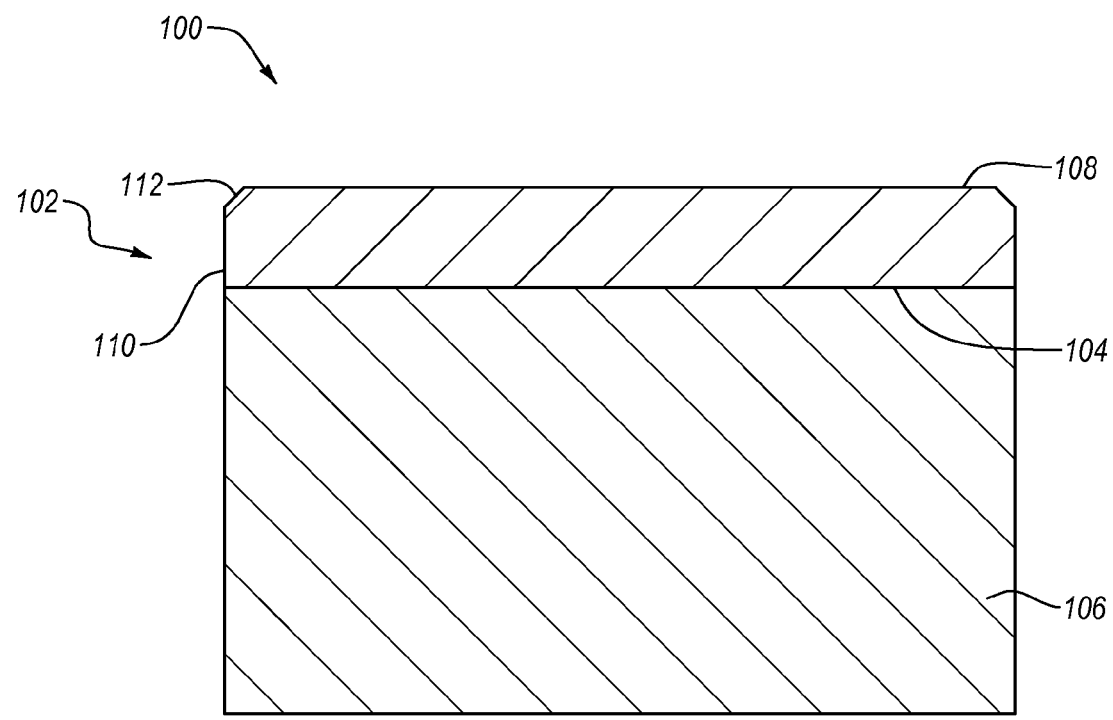
FIG. 1A a cross-sectional view of a PDC according to an embodiment.
Figure 1B:
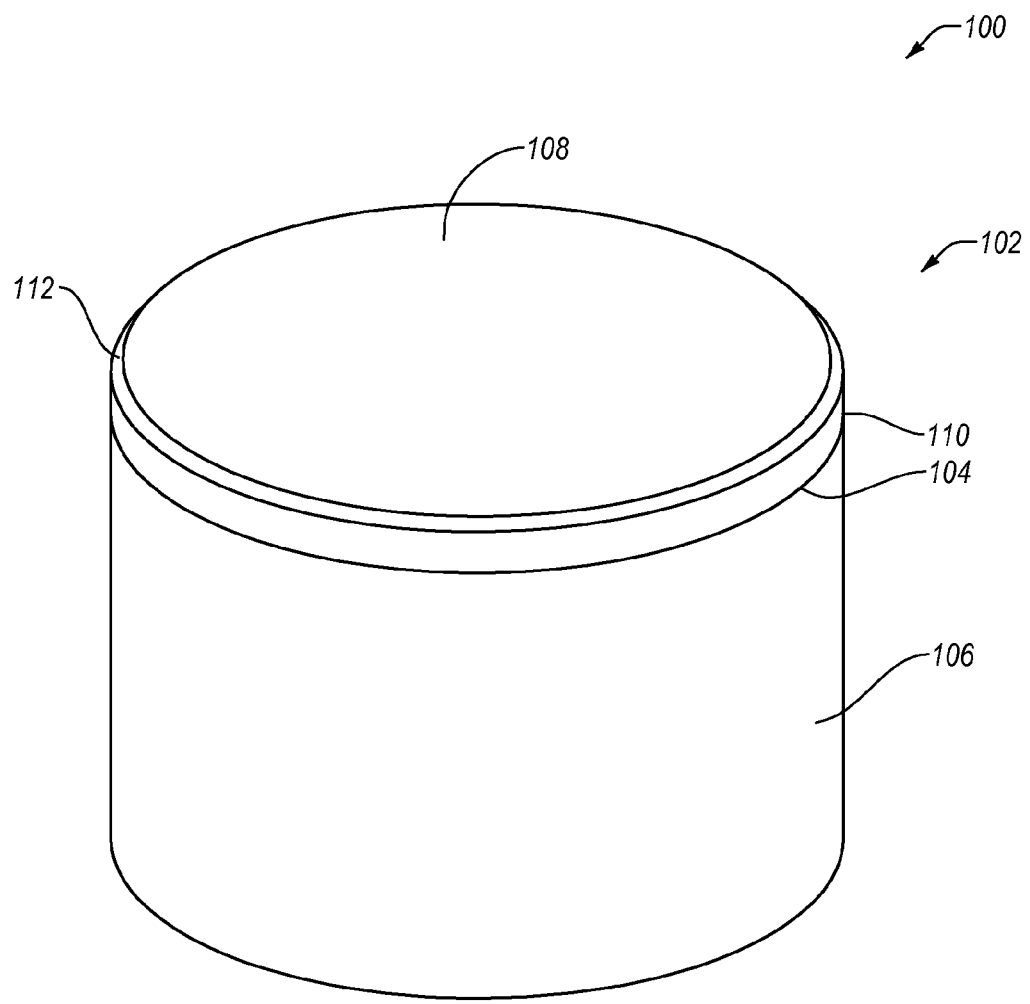
FIG. 1B is an isometric view of the PDC shown in FIG. 1A.

Embodiments of the invention relate to a PDC including a PCD table having a diamond grain size distribution selected for enhanced leachability, methods of fabricating such PDCs, and applications for such PDCs in rotary drill bits, bearing apparatuses, wire-drawing dies, machining equipment, and other articles and apparatuses. FIGS. 1A and 1B are cross-sectional and isometric views, respectively, of a PDC 100 according to an embodiment. The PDC 100 includes a PCD table 102 bonded to an interfacial surface 104 of a substrate 106. The PCD table 102 includes an upper surface 108, at least one lateral surface 110, and an optional chamfer 112 extending therebetween. One or more of the upper surface 108, at least one lateral surface 110, or chamfer 112 may function as a working/cutting or bearing surface during use. In an embodiment, the PCD table 102 may be integrally formed with the substrate 106, while in other embodiments, the PCD table 102 may be preformed and bonded to the substrate 106. Although FIGS. 1A and 1B show the upper surface 108 and the interfacial surface 104 as being substantially planar, the upper surface 108 and/or the interfacial surface 104 may be concave, convex, or another selected non-planar geometry.

The substrate 106 may be generally cylindrical or another selected configuration, without limitation. The substrate 106 may also include, without limitation, cemented carbides, such as tungsten carbide, titanium carbide, chromium carbide, niobium carbide, tantalum carbide, vanadium carbide, or combinations thereof cemented with iron, nickel, cobalt, or alloys thereof. For example, in an embodiment, the substrate 106 comprises cobalt-cemented tungsten carbide.

The PCD table 102 includes a plurality of diamond grains directly bonded together via diamond-to-diamond bonding (e.g., $sp^3$ bonding) that defines a plurality of interstitial regions. At least a portion of the interstitial regions or, in some embodiments, substantially all of the interstitial regions may be occupied by a metal-solvent catalyst and/or metallic infiltrant, such as iron, nickel, cobalt, or alloys of any of the foregoing metals.

The plurality of diamond grains of the PCD table 102 may exhibit a selected bimodal, tri-modal, or greater grain size distribution that improves leachability. It is currently believed by the inventors that the interstitial regions of the PCD table 102 are relatively more interconnected due to the selected diamond grain size distribution, which enables relatively faster and/or more complete leaching of the metal-solvent catalyst and/or metallic infiltrant from the PCD table 102. In one or more embodiments, the plurality of diamond grains may include a first amount that is about 30 volume % to about 65 volume % of the plurality of diamond grains, a second amount that is about 18 to about 65 volume % of the plurality of diamond grains, and a third amount that is about 0 volume % to about 40 volume %. The first amount may exhibit a first average grain size of about 8 μm to about 22 μm, the second amount may exhibit a second average grain size that is greater than the first average grain size and about 15 μm to about 50 μm, and, when present, the third amount may exhibit a third average grain size greater than the first average grain size and less than the second average grain size and about 15 μm to about 22 μm. In an embodiment, the first amount may be about 35 volume % to about 45 volume % (e.g., about 38 volume % to about 40 volume %, about 38 volume % to about 42 volume %, or about 40 volume %) and the second amount may be about 55 volume % to about 65 volume % (e.g., about 58 volume % to about 62 volume %, or about 60 volume %). In the embodiment, the first amount may be about 40 volume % to about 60 volume % (e.g., about 40 to about 45 volume %, about 55 volume % to about 60 volume %, or about 45 volume % to about 55 volume %) and the second amount may be about 20 volume % to about 50 volume % (e.g., about 20 volume % to about 30 volume %, about 20 to about 40 volume %, or about 45 volume % to about 55 volume %). In other embodiments, the second amount may be about 35 volume % to about 45 volume % (e.g., about 38 volume % to about 40 volume %, about 38 volume % to about 42 volume %, or about 40 volume %) and the first amount may be about 55 volume % to about 65 volume % (e.g., about 58 volume % to about 62 volume %, or about 60 volume %). In any of the embodiments, any combination of the following first and second average grains sizes may be combined with any of the disclosed first and second amounts: the first average grain size may be about 10 μm to about 22 μm (e.g., about 8 μm to about 14 μm, about 10 μm to about 12 μm, about 15 μm to about 25 μm, about 11 μm to about 12 μm, or about 12 μm) and the second average grain size may be about 18 μm to about 50 μm (e.g., about 18 μm to about 22 μm, about 19 μm to about 21 μm, about 20 μm, about 20 μm to about 45 μm, about 20 μm to about 40 μm, or about 25 μm to about 35 μm). In another more detailed embodiment, the first amount is about 40 volume % to about 50 volume % (e.g., about 45 volume %) with a first average grain size of about 10 μm to about 14 μm (e.g., about 12 μm), the second amount is about 30 volume % to about 36 volume % (e.g., about 34 volume %) with a second average grain size of about 18 μm to about 22 μm (e.g., about 20 μm), and the third amount is about 30 volume % to about 35 volume % (e.g., about 34 volume %) with a third average grain size of about 18 μm to about 22 μm (e.g., about 20 μm). Stated another way, a ratio of the first average grain size to the second average grain size may be about 0.3 to about 0.7, such as about 0.35 to about 0.45, about 0.4 to about 0.65, or about 0.55 to about 0.6. It is currently believed by the inventors that the leachability increases as the volume % of the relatively larger sized second amount of diamond grains increases, while wear resistance increases as the volume % of the relatively smaller sized first amount of diamond grains increases.

In an embodiment, the PCD table 102 may also include at least one additive selected for accelerating leaching of the metal-solvent catalyst and/or metallic infiltrant from the PCD table 102. For example, the at least one additive may include boron grains, boron carbide grains, grains made of refractory metals (e.g., niobium, molybdenum, tantalum, tungsten, rhenium, hafnium, or alloys thereof), or combinations thereof. The amount of the at least one additive present in the PCD table 102 may be greater than 0 weight % to about 5 weight % of the PCD table 102, such as greater than 0 weight % to about 0.5 weight %, about 0.05 weight % to about 0.1 weight %, or about 1 weight % to about 3 weight % of the PCD table 102, with the balance substantially being diamond grains and the metal-solvent catalyst and/or metallic infiltrant. Some embodiments of suitable additives can be found in U.S. patent application Ser. No. 12/608,155 filed on 29 Oct. 2009, the disclosure of which is incorporated herein, in its entirety, by this reference.

In one or more embodiments, the $G_{ratio}$ of the PCD table 102 of the PDC 100 may be about $1 \times 10^7$ to about $5 \times 10^7$, such as about $1.5 \times 10^7$ to about $4 \times 10^7$, about $2 \times 10^7$ to about $4.0 \times 10^7$, about $2.5 \times 10^7$ to about $3.5 \times 10^7$. The $G_{ratio}$ may be evaluated using a vertical turret lathe ("VTL") test by measuring the volume of the PDC 100 removed versus the volume of Barre granite workpiece removed, while the workpiece is cooled with water. The test parameters may include a depth of cut for the PDC 100 of about 0.254 mm, a back rake angle for the PDC 100 of about 20 degrees, an in-feed for the PDC 100 of about 6.35 mm/rev, and a rotary speed of the workpiece to be cut of about 101 RPM. $G_{ratio}$ is the ratio of the volume of the PDC 100 removed to the volume of the PDC 100 removed.

Figure 2:
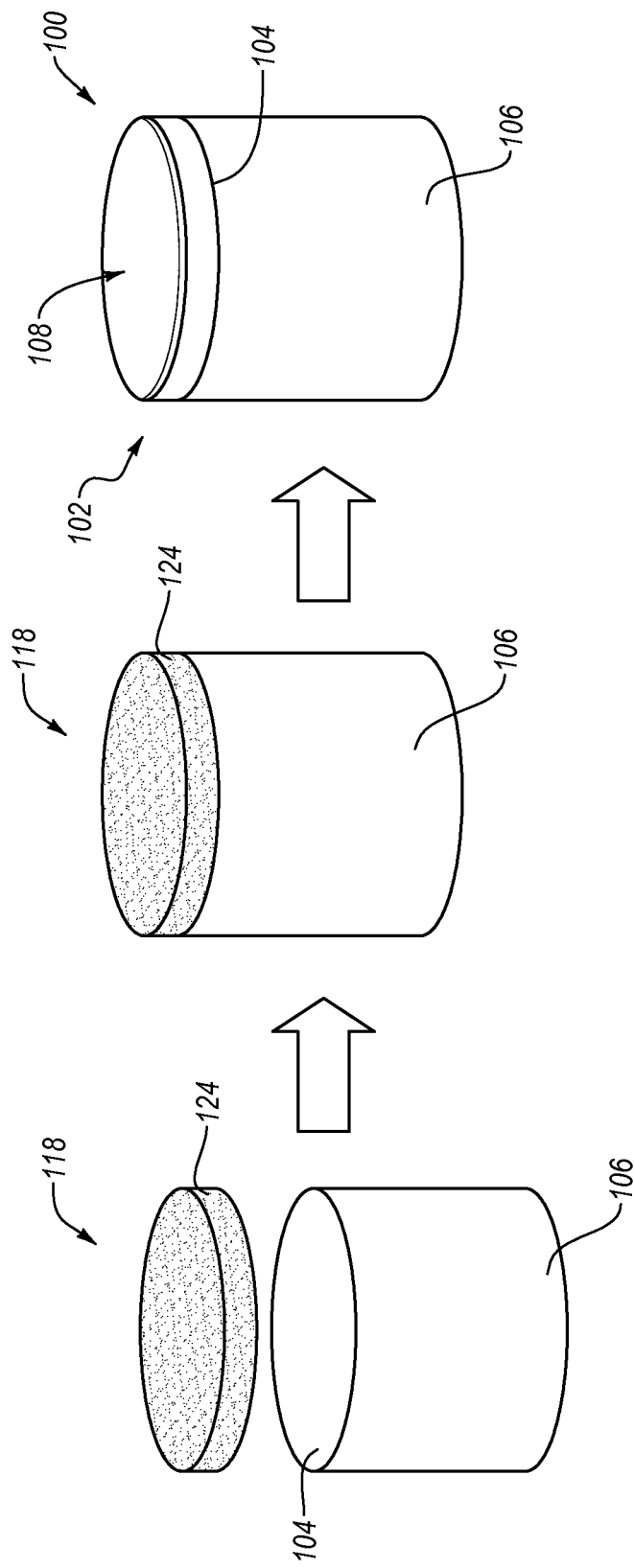
FIG. 2 is a schematic illustration of a method of fabricating the PDC shown in FIGS. 1A and 1B according to an embodiment.

FIG. 2 is a schematic illustration of a method for fabricating the PDC 100 shown in FIGS. 1A and 1B. FIG. 2 illustrates a PDC precursor assembly 118 including one or more layers 124 including a plurality of diamond particles. The plurality of diamond particles may exhibit a bimodal, tri-modal, or greater particle size distribution that is substantially the same or similar to that of the diamond grain size distributions described above for the PCD table 102. That is, the plurality of diamond particles may exhibit two, three, or more distinct particle size modes. In one or more embodiments, the plurality of diamond particles may include a first amount that is about 30 weight % to about 65 weight % of the plurality of diamond particles, a second amount that is about 18 to about 65 weight % of the plurality of diamond particles, and a third amount that is about 0 weight % to about 40 weight %. The first amount may exhibit a first average particle size of about 8 μm to about 14 μm, the second amount may exhibit a second average particle size that is greater than the first average grain size and about 15 μm to about 50 μm, and, when present, the third amount may exhibit a third average particle size greater than the first average particle size and less than the second average particle size and about 15 μm to about 22 μm. In embodiment, the first amount may be about 35 weight % to about 45 weight % (e.g., about 38 weight % to about 40 weight %, about 38 weight % to about 42 weight %, or about 40 weight %) and the second amount may be about 55 weight % to about 65 weight % (e.g., about 58 weight % to about 62 weight %, or about 60 weight %). In an embodiment, the first amount may be about 40 weight % to about 60 weight % (e.g., about 40 weight % to about 45 weight %, about 55 weight % to about 60 weight %, or about 45 weight % to about 55 weight %) and the second amount may be about 20 weight % to about 50 weight % (e.g., about 20 weight % to about 30 weight %, about 20 weight % to about 40 weight %, or about 45 weight % to about 55 weight %). In other embodiments, the second amount may be about 35 weight % to about 45 weight % (e.g., about 38 weight % to about 40 weight %, about 38 weight % to about 42 weight %, or about 40 weight %) and the first amount may be about 55 weight % to about 65 weight % (e.g., about 58 weight % to about 62 weight %, or about 60 weight %). In any of the embodiments, any combination of the following first and second average particle sizes may be combined with any of the disclosed first and second amounts: the first average particle size may be about 10 μm to about 22 μm (e.g., about 8 μm to about 14 μm, about 10 μm to about 12 μm, about 15 μm to about 25 μm, about 11 μm to about 12 μm, or about 12 μm) and the second average particle size may be about 18 μm to about 22 μm (e.g., about 19 μm to about 21 μm, about 20 μm, about 20 μm to about 45 μm, about 20 μm to about 40 μm, or about 25 μm to about 35 μm). In another more detailed embodiment, the first amount is about 40 volume % to about 50 volume % (e.g., about 45 volume %) with a first average grain size of about 10 μm to about 14 μm (e.g., about 12 μm), the second amount is about 30 volume % to about 36 volume % (e.g., about 34 volume %) with a second average grain size of about 18 μm to about 22 μm (e.g., about 20 μm), and the third amount is about 30 volume % to about 35 volume % (e.g., about 34 volume %) with a third average particle size of about 18 μm to about 22 μm (e.g., about 20 μm). Stated another way, a ratio of the first average particle size to the second average particle size may be about 0.3 to about 0.7, such as about 0.35 to about 0.45, about 0.4 to about 0.65, or about 0.55 to about 0.6. It is currently believed by the inventors that the leachability of the PCD table 102 so formed increases as the weight % of the relatively larger sized second amount of diamond particles increases, while wear resistance of the PCD table 102 increases as the weight % of the relatively smaller sized first amount of diamond particles increases.

In an embodiment, the layer 124 may also include at least one additive selected for accelerating leaching of the metal-solvent catalyst therefrom that together defines the interstitial regions having the metal-solvent catalyst disposed in at least a portion of the interstitial regions. For example, the at least one additive may include boron particles, boron carbide particles, particles made of refractory metals (e.g., niobium, molybdenum, tantalum, tungsten, rhenium, hafnium, or alloys thereof), or combinations thereof. The amount of the at least one additive present in the layer 124 may be greater than 0 weight % to about 5 weight %, such as greater than 0 weight % to about 0.5 weight %, about 0.05 weight % to about 0.1 weight %, or about 1 weight % to about 3 weight % of the layer 124. Some embodiments of suitable additives can be found in U.S. patent application Ser. No. 12/608,155 filed on 29 Oct. 2009.

The PDC precursor assembly 118 may be subjected to an HPHT process to form the PDC 100 (shown in FIGS. 1A, 1B, and 2). The PCD precursor assembly 120 and the substrate 106 may be placed in a pressure transmitting medium to form the PDC precursor assembly 118. For example, the pressure transmitting medium may include a refractory metal can, graphite structure, pyrophyllite, other pressure transmitting structures, or combinations thereof. Examples of suitable gasket materials and cell structures for use in manufacturing PCD are disclosed in U.S. Pat. Nos. 6,338,754 and 8,236,074, each of which is incorporated herein, in its entirety, by this reference. Another example of a suitable pressure transmitting material is pyrophyllite, which is commercially available from Wonderstone Ltd. of South Africa. The PDC precursor assembly 118, including the pressure transmitting medium and the diamond particles therein, is subjected to an HPHT process at diamond-stable conditions using an ultra-high pressure press at a temperature of at least about 1000° C. (e.g., about 1100° C. to about 2200° C., or about 1200° C. to about 1450° C.) and a cell pressure in the pressure transmitting medium of at least about 5 GPa (e.g., about 5.0 GPa to about 6.5 GPa, about 7.5 GPa to about 15 GPa, or at least about 7.5 GPa) for a time sufficient to sinter the diamond particles together in the presence of the metal-solvent catalyst and form the PCD table 102 comprising directly bonded-together diamond grains defining interstitial regions occupied by a metal-solvent catalyst. For example, the pressure in the pressure transmitting medium employed in the HPHT process may be at least about 8.0 GPa, at least about 9.0 GPa, at least about 10.0 GPa, at least about 11.0 GPa, at least about 12.0 GPa, or at least about 14 GPa.

The pressure values employed in the HPHT processes disclosed herein refer to the pressure in the pressure transmitting medium at room temperature (e.g., about 25° C.) with application of pressure using an ultra-high pressure press and not the pressure applied to the exterior of the PDC precursor assembly 118. The actual pressure in the pressure transmitting medium at sintering temperature may be slightly higher. The ultra-high pressure press may be calibrated at room temperature by embedding at least one calibration material that changes structure at a known pressure such as, PbTe, thallium, barium, or bismuth in the pressure transmitting medium. Further, optionally, a change in resistance may be measured across the at least one calibration material due to a phase change thereof. For example, PbTe exhibits a phase change at room temperature at about 6.0 GPa and bismuth exhibits a phase change at room temperature at about 7.7 GPa. Examples of suitable pressure calibration techniques are disclosed in G. Rousse, S. Klotz, A. M. Saitta, J. Rodriguez-Carvajal, M. I. McMahon, B. Couzinet, and M. Mezouar, "Structure of the Intermediate Phase of PbTe at High Pressure," Physical Review B: Condensed Matter and Materials Physics, 71, 224116 (2005) and D. L. Decker, W. A. Bassett, L. Merrill, H. T. Hall, and J. D. Barnett, "High-Pressure Calibration: A Critical Review," J. Phys. Chem. Ref. Data, 1, 3 (1972).

The PDC 100 so-formed includes the PCD table 102, which is integrally formed with the substrate 106 and bonded to the interfacial surface 104 of the substrate 106. If the substrate 106 includes a metal-solvent catalyst (e.g., cobalt in a cobalt-cemented tungsten carbide substrate), the metal-solvent catalyst therein may liquefy and infiltrate the layer 124 to promote growth between adjacent diamond particles to catalyze formation of the PCD table 102. For example, if the substrate 106 is a cobalt-cemented tungsten carbide substrate, cobalt from the substrate 106 may be liquefied and infiltrate the layer 124 to catalyze formation of diamond-to-diamond bonding in the PCD table 102 during the HPHT process.

Figure 3:
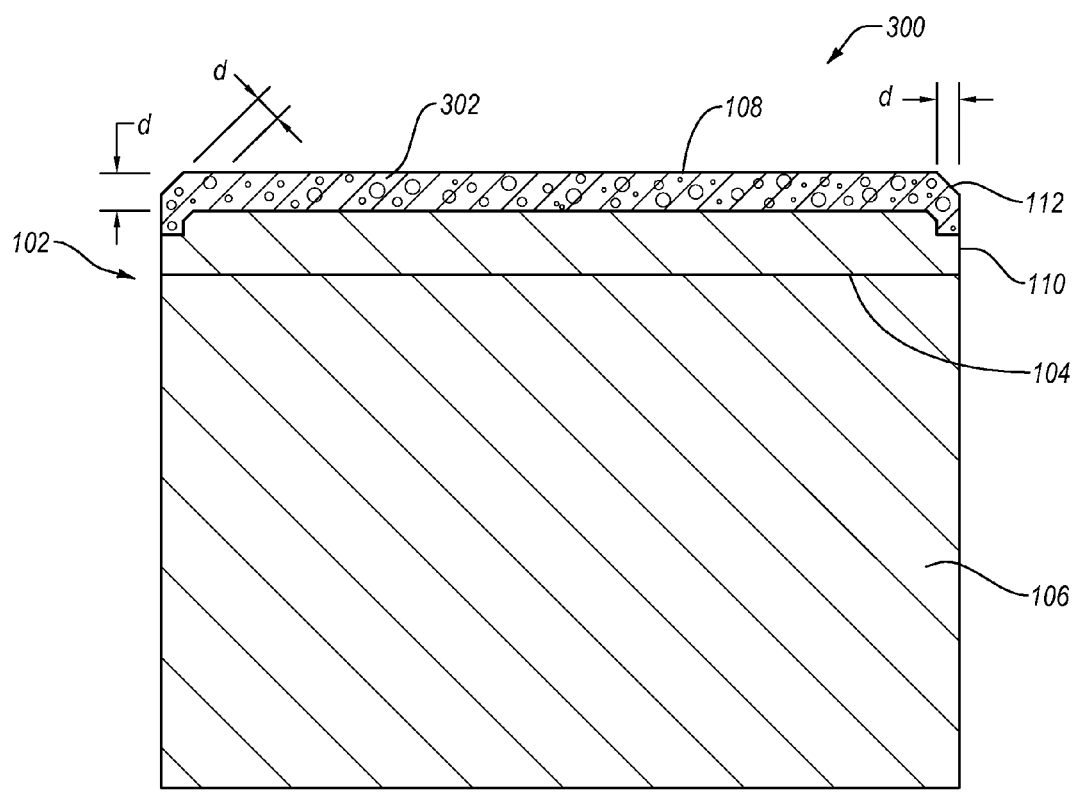
FIG. 3 is a cross-sectional view of the PDC shown in FIGS. 1A, 1B, and 2 in which a PCD table thereof has been at least partially leached.

Referring to FIG. 3, in an embodiment, after HPHT processing, the metal-solvent catalyst may be leached from the PCD table 102 shown in FIGS. 1A and 1B to a selected depth using a liquid acid leaching or a gaseous leaching process. In an embodiment, the leaching performed in either a leaching solution or a gaseous environment may be conducted in a pressurized atmosphere (e.g., a pressurized leaching vessel). For example, FIG. 3 is a cross-sectional view of an embodiment of a PDC 300 in which the metal-solvent catalyst is at least partially leached from the PCD table 102 to a selected depth "d" as measured from at least one of the upper surface 108, at least one lateral surface 110, or chamfer 112 to form a leached region 302 that is at least partially depleted of the metal-solvent catalyst. For example, the leached region 302 may generally contour the upper surface 108, the chamfer 112, and the at least one lateral surface 110. The leached region 302 may also extend along a selected length of the at least one lateral surface 110. Generally, the selected depth "d" may be less than about 100 µm, greater than 250 µm, about 200 µm to about 600 µm, greater than 300 µm to about 425 µm, about 180 µm to about 265 µm, greater than 350 µm to about 400 µm, greater than 350 µm to about 375 µm, about 375 µm to about 400 µm, about 500 µm to about 650 µm, about 400 µm to about 600 µm, about 600 µm to about 800 µm, or about 10 µm to about 500 µm.

A residual amount of the metal-solvent catalyst may still be present in the leached region 302 even after leaching. For example, the metal-solvent catalyst may comprise about 0.8 weight % to about 1.50 weight % and, more particularly, about 0.9 weight % to about 1.2 weight % of the leached region 302. The leaching may be performed in a suitable acid (e.g., aqua regia, nitric acid, hydrochloric acid, hydrofluoric acid, or combinations thereof) so that the leached region 302 of the PCD table 102 is substantially free of the metal-solvent catalyst. As a result of the metal-solvent catalyst being depleted from the leached region 302, the at least partially leached PCD table 102 is relatively more thermally stable than prior to leaching. As previously discussed, the selected diamond grain size distribution of the PCD table 102 allows for relatively faster and/or more complete leaching of the metal-solvent catalyst.

In some embodiments, the leaching to form the leached region 302 may be accomplished by exposing the PCD table 102 to a gaseous leaching agent that is selected to substantially remove all of the metal-solvent catalyst from the interstitial regions of the PCD table 102. For example, a gaseous leaching agent may be selected from at least one halide gas, at least one inert gas, a gas from the decomposition of an ammonium halide salt, hydrogen gas, carbon monoxide gas, an acid gas, and mixtures thereof. For example, a gaseous leaching agent may include mixtures of a halogen gas (e.g., chlorine, fluorine, bromine, iodine, or combinations thereof) and an inert gas (e.g., argon, xenon, neon, krypton, radon, or combinations thereof). Other gaseous leaching agents include mixtures including hydrogen chloride gas, a reducing gas (e.g., carbon monoxide gas), gas from the decomposition of an ammonium salt (such as ammonium chloride which decomposes into chlorine gas, hydrogen gas and nitrogen gas), and mixtures of hydrogen gas and chlorine gas (which will form hydrogen chloride gas, in situ), acid gases such as hydrogen chloride gas, hydrochloric acid gas, hydrogen fluoride gas, and hydrofluoric acid gas. Any combination of any of the disclosed gases may be employed as the gaseous leaching agent. In an embodiment, a reaction chamber may be filled with a gaseous leaching agent of about 10 volume % to about 20 volume % chlorine with the balance being argon and the gaseous leaching agent being at an elevated temperature of at least about 300° C. to about 800° C. In another embodiment, the elevated temperature may be between at least about 600° C. to about 700° C. More specifically, in another embodiment, the elevated temperature may be at least about 650° C. to about 700° C. Additional details about gaseous leaching processes for leaching PCD are disclosed in U.S. application Ser. No. 13/324,237. U.S. application Ser. No. 13/324,237 is incorporated herein, in its entirety, by this reference.

Figure 4:
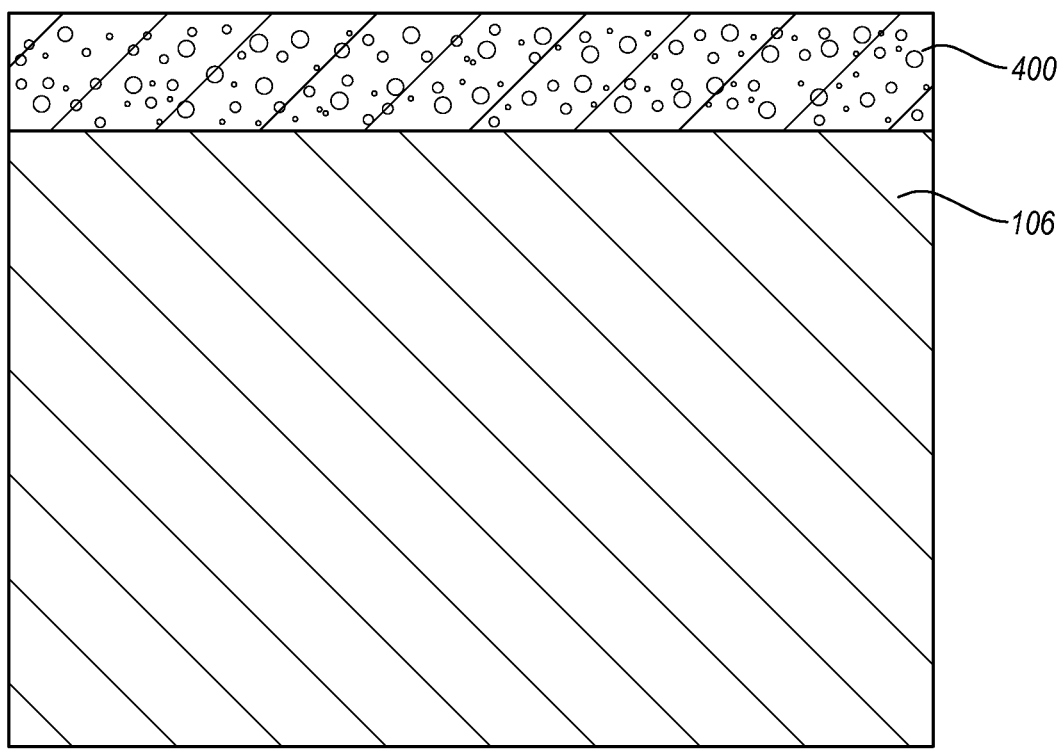
FIG. 4 is an assembly to be HPHT processed including a leached PCD table assembled with a substrate.

In other embodiments, the PCD table 102 may be initially formed using an HPHT sintering process (i.e., a pre-formed PCD table) and, subsequently, bonded to the interfacial surface 104 of the substrate 106 by brazing, using a separate HPHT bonding process, or any other suitable joining technique, without limitation. For example, the PCD table 102 may be HPHT sintered and then separated from the substrate 106 using any suitable material removal process, such as grinding or machining. In another embodiment, a PCD table may be HPHT sintered without a substrate, such as by infiltrating the diamond particles from a disc of metal-solvent catalyst. The PCD table 102 may be leached to at least partially remove or to remove substantially all of the metal-solvent catalyst therein. As previously discussed, the selected diamond grain size distribution of the PCD table 102 enables relatively more complete leaching. As shown in FIG. 4, in an embodiment, an at least partially leached PCD table 400 may be placed adjacent to another substrate 106 and subjected to any of the HPHT processes disclosed herein so that a metallic infiltrant from the substrate 106 (e.g., cobalt from a cobalt-cemented tungsten carbide substrate) or another source (e.g., a disk of metallic infiltrant) re-infiltrates the at least partially leached PCD table 102. The infiltrated PCD table bonds to the substrate 106 during cooling from the HPHT process. The infiltrated PCD table may be at least partially leached to form a PDC configured the same or similarly to the PDC 300 shown in FIG. 3.

Working and Prophetic Examples

The following working and prophetic examples provide further detail in connection with the specific embodiments described above. Working examples 4-7 fabricated according to specific embodiments of the invention are compared to comparative working examples 1-3, 8, and 9. Prophetic examples 10-12 and their predicted leach depths are also described below.

Comparative Working Example 1

PDCs were formed according to the following process. A layer of diamond particles having an average particle size of about 20 µm mixed with about 0.1 weight % boron was disposed on a cobalt-cemented tungsten carbide substrate. The layer of diamond particles and the cobalt-cemented tungsten carbide substrate were HPHT processed in a high-pressure cubic press at a temperature of about 1400° C. and a cell pressure of at least 7.7 GPa to form a PDC comprising a PCD table integrally formed and bonded to the cobalt-cemented tungsten carbide substrate. The PCD table was leached to for about 144 hours in a mixture of hydrofluoric acid and nitric acid to produce a leach depth of about 582 µm on average for the samples.

Figure 5A:
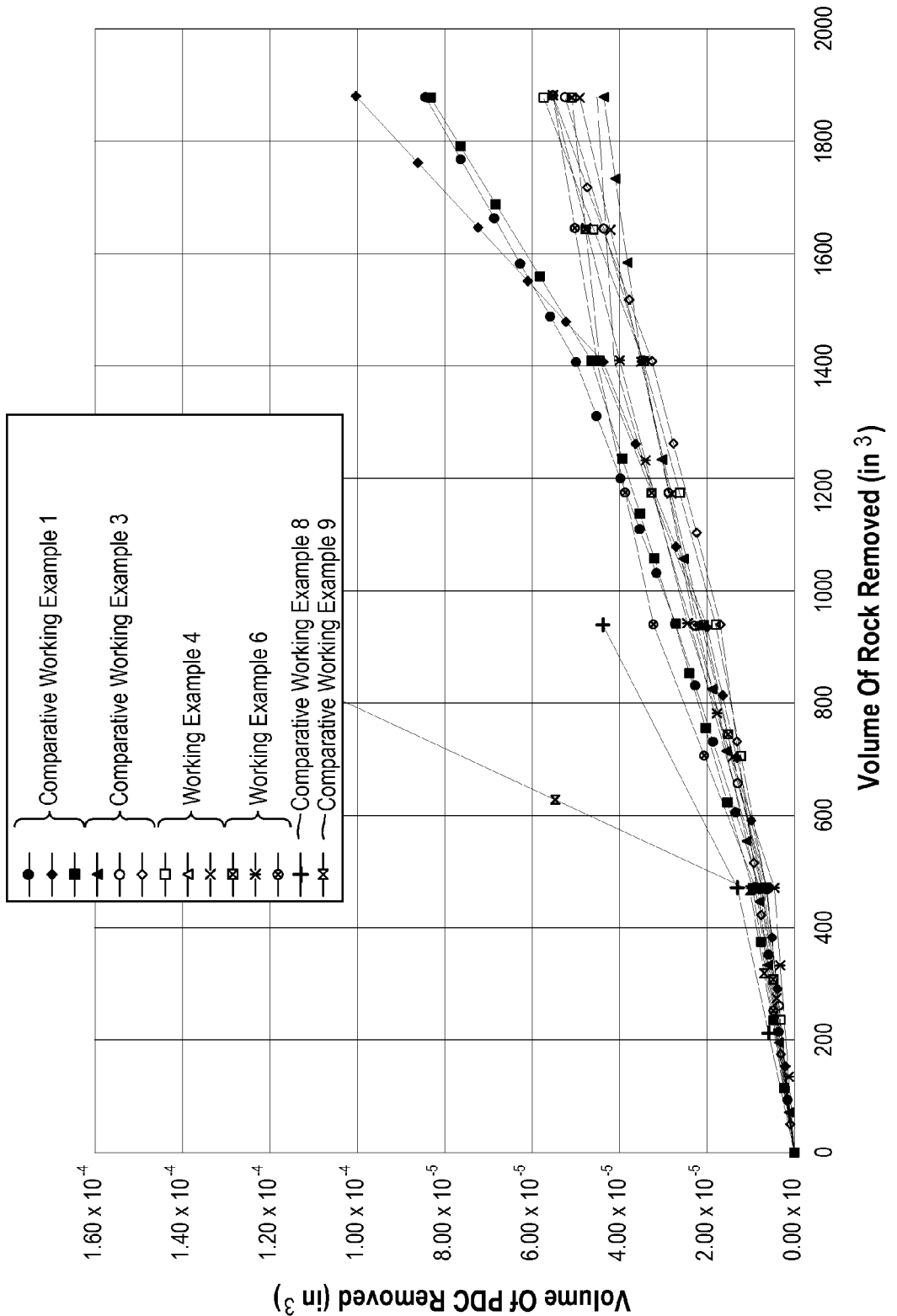
FIG. 5A is a graph of wear resistance test data for PDCs according to various working examples of invention and various comparative working examples.

The abrasion resistance of the PDCs of comparative working example 1 was evaluated using a VTL test by measuring the volume of PDC removed versus the volume of Barre granite workpiece removed, while the workpiece was cooled with water. The test parameters used were a depth of cut for the PDC of about 0.254 mm, a back rake angle for the PDC of about 20 degrees, an in-feed for the PDC of about 6.35 mm/rev, and a rotary speed of the workpiece to be cut of about 101 RPM. FIG. 5A shows the abrasion resistance VTL test results for the PDC of comparative working example 1.

Comparative Working Example 2

PDCs were formed according to the process described above for working example 1 except no boron was mixed with the diamond particles.

Comparative Working Example 3

PDCs were formed according to the following process. A layer of diamond particles having an average particle size of about 19 µm was disposed on a cobalt-cemented tungsten carbide substrate. The layer of diamond particles and the cobalt-cemented tungsten carbide substrate were HPHT processed in a high-pressure cubic press at a temperature of about 1400° C. and a cell pressure of at least 7.7 GPa to form a PDC comprising a PCD table integrally formed and bonded to the cobalt-cemented tungsten carbide substrate. The PCD table was leached to for about 144 hours in a mixture of hydrofluoric acid and nitric acid to produce a leach depth of about 418 µm on average for the samples.

The abrasion resistance of the PDCs of comparative working example 3 was evaluated by measuring the volume of PDC removed versus the volume of Barre granite workpiece removed, while the workpiece was cooled with water, using the same workpiece and the same test parameters as comparative working example 1.

Working Example 4

PDCs were formed according to the following process. Diamond particles (about 40 weight percent diamond particles having an average particle size of about 12 µm and about 60 weight percent diamond particles having an average particle size of about 20 µm) was mixed with 0.1 weight % boron particles to form a mixture. The mixture of diamond particles and boron particles was disposed on a cobalt-cemented tungsten carbide substrate. The mixture and the cobalt-cemented tungsten carbide substrate were HPHT processed in a high-pressure cubic press at a temperature of about 1400° C. and a cell pressure of at least 7.7 GPa to form a PDC comprising a PCD table integrally formed and bonded to the cobalt-cemented tungsten carbide substrate. The PCD table was leached for about 144 hours in a mixture of hydrofluoric acid and nitric acid to produce a leach depth of about 528 µm on average for the samples.

The abrasion resistance of the PDCs of working example 4 was evaluated by measuring the volume of PDC removed versus the volume of Barre granite workpiece removed, while the workpiece was cooled with water, using the same workpiece and the same test parameters as comparative working example 1.

Working Example 5

PDCs were formed according to the process described above for working example 3 except no boron was added.

Working Example 6

PDCs were formed according to the following process. Diamond particles (about 60 weight percent diamond particles having an average particle size of about 12 µm and about 40 weight percent diamond particles having an average particle size of about 20 µm) was mixed with 0.1 weight % boron particles to form a mixture. The mixture of diamond particles and boron particles was disposed on a cobalt-cemented tungsten carbide substrate. The mixture and the cobalt-cemented tungsten carbide substrate were HPHT processed in a high-pressure cubic press at a temperature of about 1400° C. and a cell pressure of at least 7.7 GPa to form a PDC comprising a PCD table integrally formed and bonded to the cobalt-cemented tungsten carbide substrate. The PCD table was leached for about 144 hours in a mixture of hydrofluoric acid and nitric acid to produce a leach depth of about 496 µm on average for the samples.

The abrasion resistance of the PDCs of working example 6 was evaluated by measuring the volume of PDC removed versus the volume of Barre granite workpiece removed, while the workpiece was cooled with water, using the same workpiece and the same test parameters as comparative working example 1.

Working Example 7

PDCs were formed according to the process described above for working example 5 except no boron was added.

Comparative Working Example 8

A PDC was formed according to the following process. A first layer of diamond particles having an average particle size of about 19 µm was disposed on a cobalt-cemented tungsten carbide substrate. The layer of diamond particles and the cobalt-cemented tungsten carbide substrate were HPHT processed in a high-pressure cubic press at a temperature of about 1400° C. and a cell pressure of approximately 5.5 GPa to form a PDC comprising a PCD table integrally formed and bonded to the cobalt-cemented tungsten carbide substrate. The PCD table was leached to a depth of about 292 µm.

The abrasion resistance of the conventional PDC of comparative working example 8 was evaluated by measuring the volume of PDC removed versus the volume of Barre granite workpiece removed using the same test parameters and workpiece as comparative working example 1.

Comparative Working Example 9

A PDC was formed according to the following process. A first layer of diamond particles having an average particle size of about 19 µm was disposed on a cobalt-cemented tungsten carbide substrate. The layer of diamond particles and the cobalt-cemented tungsten carbide substrate were HPHT processed in a high-pressure cubic press at a temperature of about 1400° C. and a cell pressure of at least 7.7 GPa to form a PDC comprising a PCD table integrally formed and bonded to the cobalt-cemented tungsten carbide substrate. The PCD table of comparative working example 6 was unleached.

The abrasion resistance of the conventional PDC of comparative working example 9 was evaluated by measuring the volume of PDC removed versus the volume of Barre granite workpiece removed using the same test parameters and workpiece as working example 1.

Comparison of Test Results

The wear resistance graph of FIG. 5A showed that working examples 4 and 6 exhibited comparable wear resistance to comparative working examples 1 and 3 and better wear resistance than that of comparative working examples 8 and 9. Furthermore, working examples 4 and 6 leached relatively quickly compared to some of the other working examples, but exhibited a relatively high wear resistance compared to other fast leaching comparative working examples, such as comparative working example 1 which had a fairly large diamond grain size. Thus, working examples 4 and 6 provided relatively fast leaching to a given leach depth, while not compromising wear resistance.

Figure 5B:
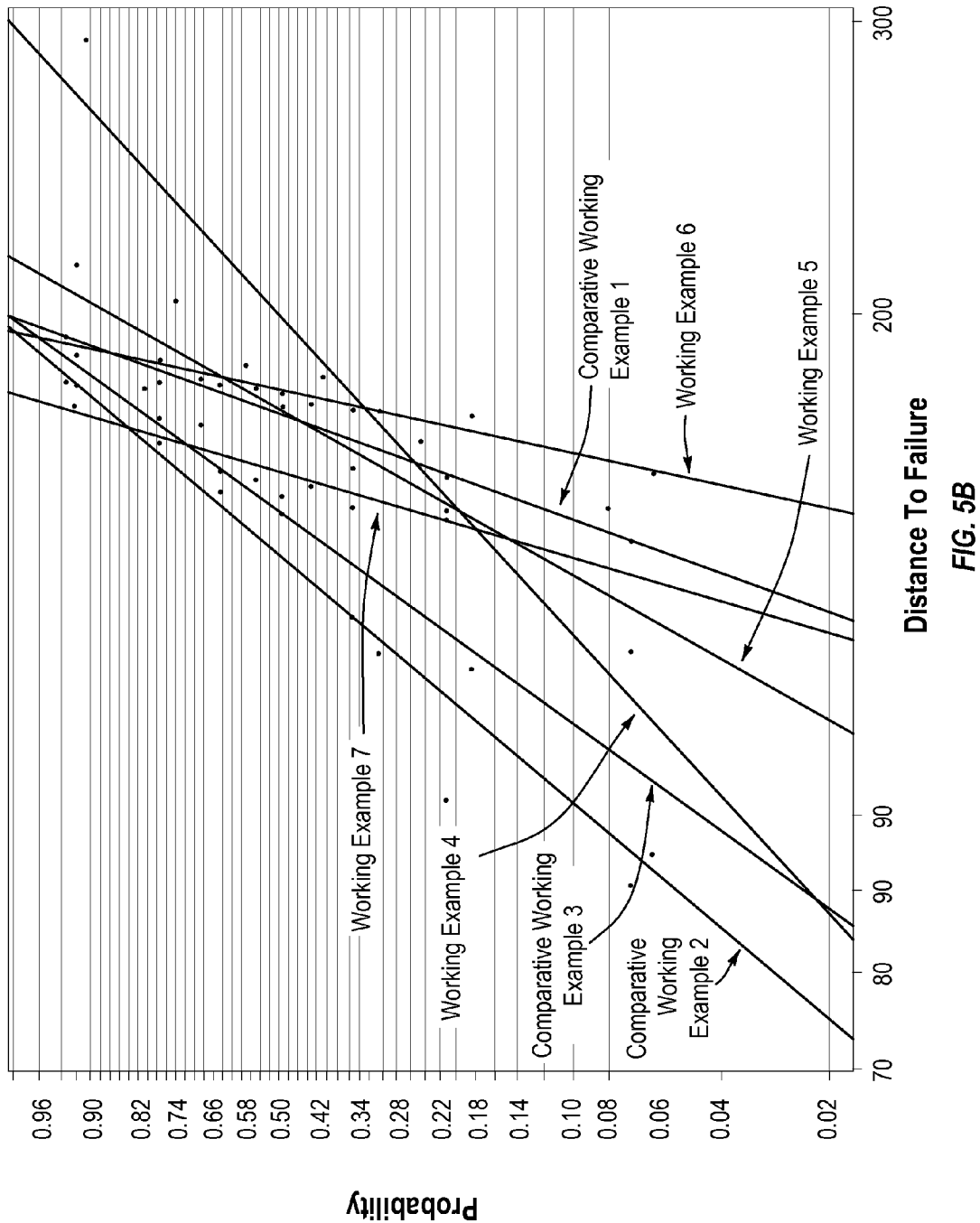
FIG. 5B is a graph of probability of failure versus distance to failure for PDCs according to various working examples of invention and various comparative working examples.

Thermal stability testing was also performed on PDCs of working examples 1-7. The results of the thermal stability testing are shown in FIG. 5B. The thermal stability was evaluated in a mill test in which a PDC is used to cut a Barre granite workpiece. The test parameters used were an in-feed for the PDC of about 50.8 cm/min, a width of cut for the PDC of about 7.62 cm, a depth of cut for the PDC of about 0.762 mm, a rotary speed of the workpiece to be cut of about 300 RPM, and an indexing in the Y direction across the workpiece of about 7.62 cm. Working example 6 exhibited the best thermal stability, but working examples 4, 5, and 7 also exhibited relatively high thermal stability and a good balance of other properties, such as leachability and wear resistance. Additionally, the PCD tables of working examples 4-7 also exhibited good non-leached abrasion resistance, while still being leachable.

Prophetic Example 10

A PDC is formed according to the following process. A mixture of diamond particles having about 50 weight percent diamond particles with an average particle size of about 20 µm and about 50 weight percent diamond particles with an average particle size of about 40 µm is formed. The mixture of diamond particles is disposed on a cobalt-cemented tungsten carbide substrate. The mixture and the cobalt-cemented tungsten carbide substrate is HPHT processed in a high-pressure cubic press at a temperature of about 1400° C. and a cell pressure of at least 7.7 GPa to form a PDC comprising a PCD table integrally formed and bonded to the cobalt-cemented tungsten carbide substrate. The PCD table is predicted to be leachable to a leach depth of about 226 µm±15 µm when leached in a mixture of hydrofluoric acid and nitric acid for 24 hours.

Prophetic Example 11

A PDC is formed according to the following process. A mixture of diamond particles having about 50 weight percent diamond particles with an average particle size of about 12 µm and about 50 weight percent diamond particles with an average particle size of about 40 µm is formed. The mixture of diamond particles is disposed on a cobalt-cemented tungsten carbide substrate. The mixture and the cobalt-cemented tungsten carbide substrate is HPHT processed in a high-pressure cubic press at a temperature of about 1400° C. and a cell pressure of at least 7.7 GPa to form a PDC comprising a PCD table integrally formed and bonded to the cobalt-cemented tungsten carbide substrate. The PCD table is predicted to be leachable to a leach depth of about 250 µm±15 µm when leached in a mixture of hydrofluoric acid and nitric acid for 24 hours.

Prophetic Example 12

A PDC is formed according to the following process. A mixture of diamond particles having about 45 weight percent diamond particles with an average particle size of about 12 µm, about 34 weight percent diamond particles with an average particle size of about 20 µm, and about 21 weight percent diamond particles with an average particle size of about 40 µm is formed. The mixture of diamond particles is disposed on a cobalt-cemented tungsten carbide substrate. The mixture and the cobalt-cemented tungsten carbide substrate is HPHT processed in a high-pressure cubic press at a temperature of about 1400° C. and a cell pressure of at least 7.7 GPa to form a PDC comprising a PCD table integrally formed and bonded to the cobalt-cemented tungsten carbide substrate. The PCD table is predicted to be leachable to a leach depth of about 246 µm±15 µm when leached in a mixture of hydrofluoric acid and nitric acid for 24 hours.

The disclosed PDC embodiments may be used in a number of different applications including, but not limited to, use in a rotary drill bit (FIGS. 6A and 6B), a thrust-bearing apparatus (FIG. 7), a radial bearing apparatus (FIG. 8), a mining rotary drill bit, and a wire-drawing die. The various applications discussed above are merely some examples of applications in which the PDC embodiments may be used. Other applications are contemplated, such as employing the disclosed PDC embodiments in friction stir welding tools.

Figure 6A:
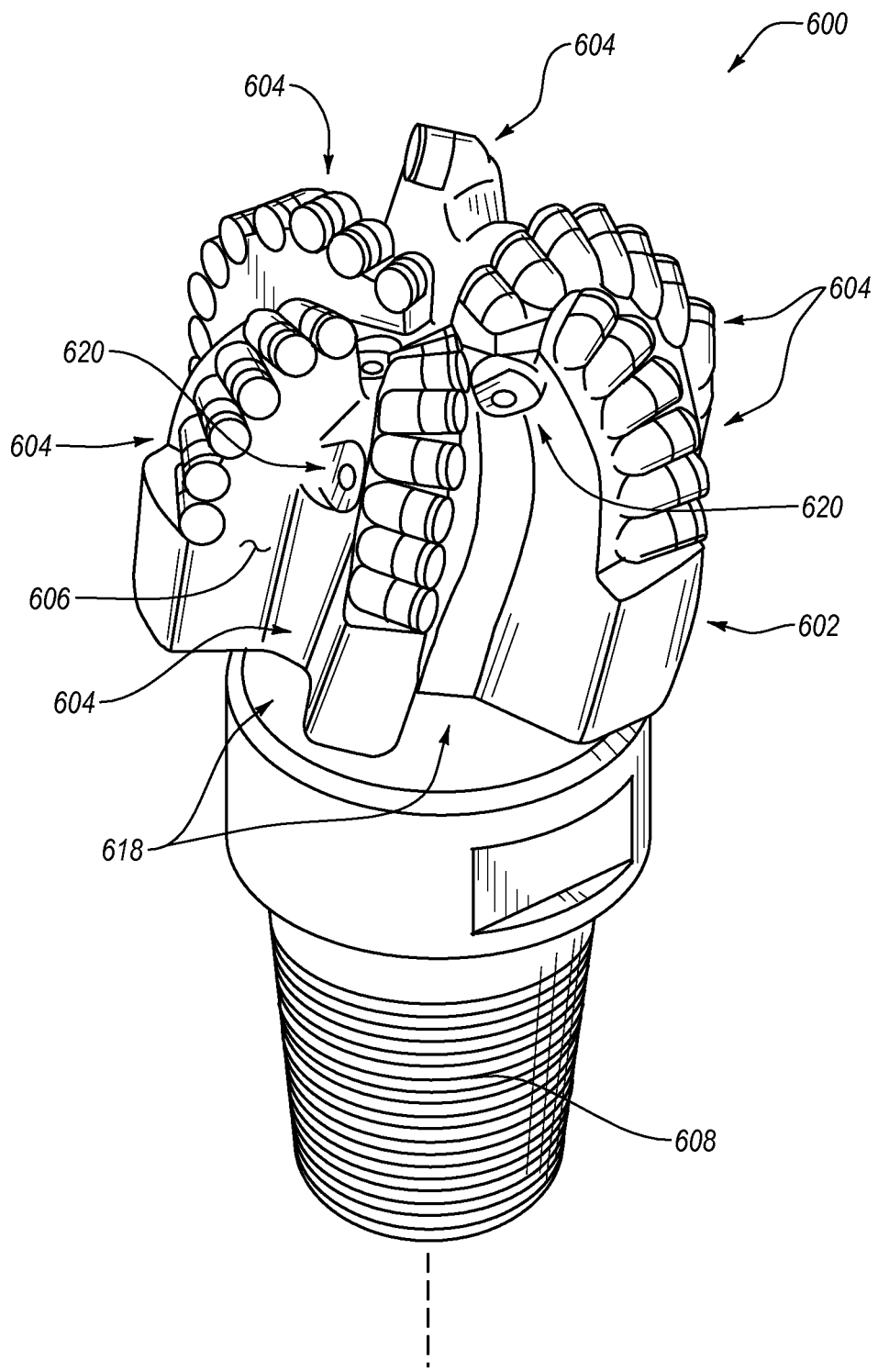
FIG. 6A is an isometric view of an embodiment of a rotary drill bit that may employ one or more of the disclosed PDC embodiments.
Figure 6B:
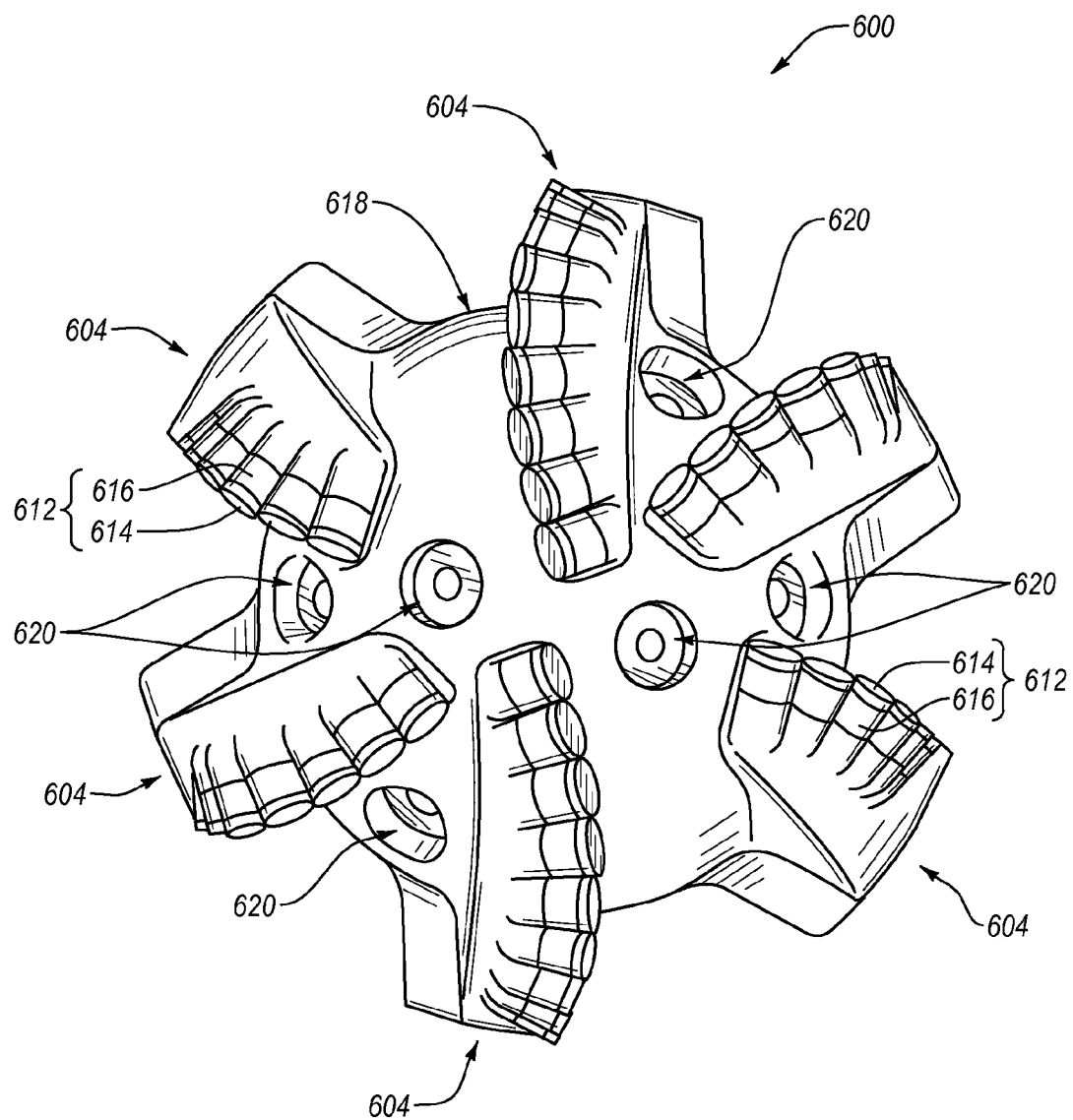
FIG. 6B is a top elevation view of the rotary drill bit shown in FIG. 6A.

FIG. 6A is an isometric view and FIG. 6B is a top elevation view of an embodiment of a rotary drill bit 600 for use in subterranean drilling applications, such as oil and gas exploration. The rotary drill bit 600 includes at least one PCD element and/or PDC configured according to any of the previously described PDC embodiments. The rotary drill bit 600 comprises a bit body 602 that includes radially and longitudinally extending blades 604 with leading faces 606, and a threaded pin connection 608 for connecting the bit body 602 to a drilling string. The bit body 602 defines a leading end structure for drilling into a subterranean formation by rotation about a longitudinal axis and application of weight-on-bit. At least one PDC cutting element, configured according to any of the previously described PDC embodiments (e.g., the PDC 100 shown in FIG. 1A) may be affixed to the bit body 602. With reference to FIG. 6B, a plurality of PDCs 612 are secured to the blades 604. For example, each PDC 612 may include a PCD table 614 bonded to a substrate 616. More generally, the PDCs 612 may comprise any PDC disclosed herein, without limitation. In addition, if desired, in some embodiments, a number of the PDCs 612 may be conventional in construction. Also, circumferentially adjacent blades 604 define so-called junk slots 618 therebetween, as known in the art. Additionally, the rotary drill bit 600 may include a plurality of nozzle cavities 620 for communicating drilling fluid from the interior of the rotary drill bit 600 to the PDCs 612.

Figure 7:
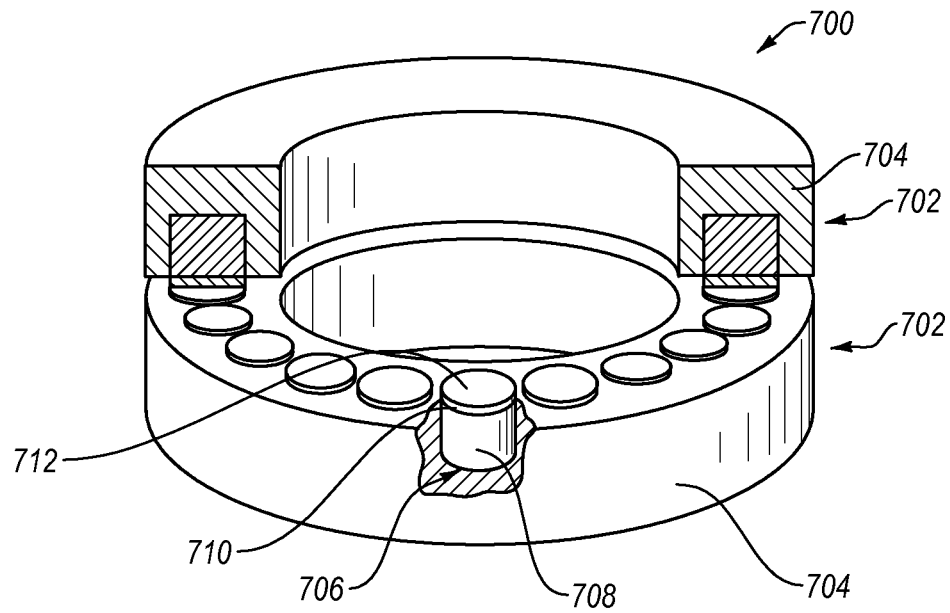
FIG. 7 is an isometric cut-away view of an embodiment of a thrust-bearing apparatus that may utilize one or more of the disclosed PDC embodiments.

FIG. 7 is an isometric cut-away view of an embodiment of a thrust-bearing apparatus 700, which may utilize any of the disclosed PDC embodiments as bearing elements. The thrust-bearing apparatus 700 includes respective thrust-bearing assemblies 702. Each thrust-bearing assembly 702 includes an annular support ring 704 that may be fabricated from a material, such as carbon steel, stainless steel, or another suitable material. Each support ring 704 includes a plurality of recesses (not labeled) that receives a corresponding bearing element 706. Each bearing element 706 may be mounted to a corresponding support ring 704 within a corresponding recess by brazing, press-fitting, using fasteners, or another suitable mounting technique. One or more, or all of bearing elements 706 may be configured according to any of the disclosed PDC embodiments. For example, each bearing element 706 may include a substrate 708 and a PCD table 710, with the PCD table 710 including a bearing surface 712.

In use, the bearing surfaces 712 of one of the thrust-bearing assemblies 702 bears against the opposing bearing surfaces 712 of the other one of the thrust-bearing assemblies 702. For example, one of the thrust-bearing assemblies 702 may be operably coupled to a shaft to rotate therewith and may be termed a "rotor." The other one of the thrust-bearing assemblies 702 may be held stationary and may be termed a "stator."

Figure 8:
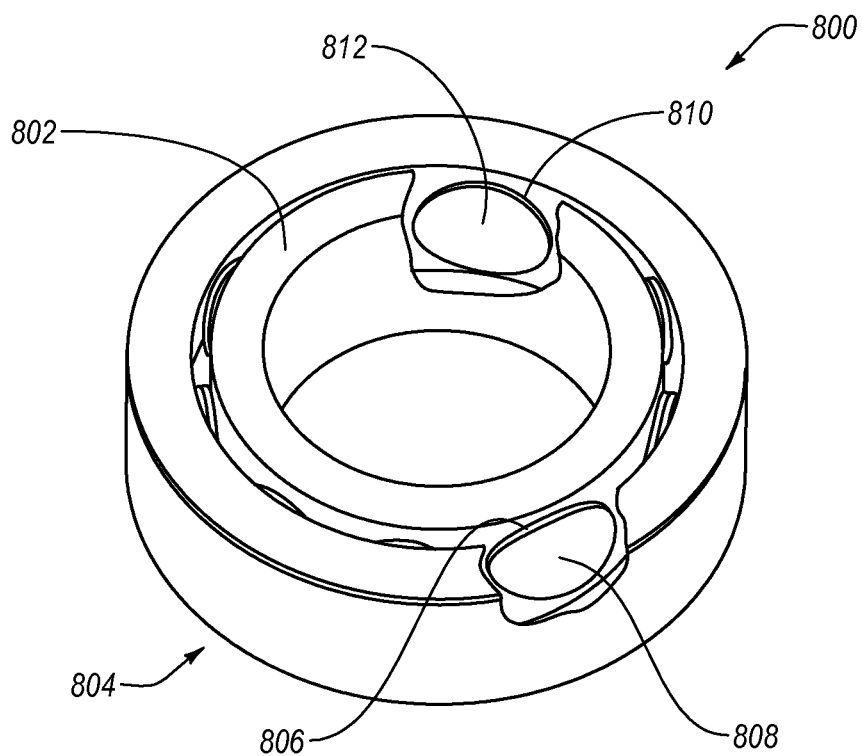
FIG. 8 is an isometric cut-away view of an embodiment of a radial bearing apparatus that may utilize one or more of the disclosed PDC embodiments.

FIG. 8 is an isometric cut-away view of an embodiment of a radial bearing apparatus 800, which may utilize any of the disclosed PDC embodiments as bearing elements. The radial bearing apparatus 800 includes an inner race 802 positioned generally within an outer race 804. The outer race 804 includes a plurality of bearing elements 810 affixed thereto that have respective bearing surfaces 812. The inner race 802 also includes a plurality of bearing elements 806 affixed thereto that have respective bearing surfaces 808. One or more, or all of the bearing elements 806 and 810 may be configured according to any of the PDC embodiments disclosed herein. The inner race 802 is positioned generally within the outer race 804 and, thus, the inner race 802 and outer race 804 may be configured so that the bearing surfaces 808 and 812 may at least partially contact one another and move relative to each other as the inner race 802 and outer race 804 rotate relative to each other during use.

The radial-bearing apparatus 800 may be employed in a variety of mechanical applications. For example, so-called "roller cone" rotary drill bits may benefit from a radial-bearing apparatus disclosed herein. More specifically, the inner race 802 may be mounted to a spindle of a roller cone and the outer race 804 may be mounted to an inner bore formed within a cone and that such an outer race 804 and inner race 802 may be assembled to form a radial-bearing apparatus.

While various aspects and embodiments have been disclosed herein, other aspects and embodiments are contemplated. The various aspects and embodiments disclosed herein are for purposes of illustration and are not intended to be limiting. Additionally, the words "including," "having," and variants thereof (e.g., "includes" and "has") as used herein, including the claims, shall be open ended and have the same meaning as the word "comprising" and variants thereof (e.g., "comprise" and "comprises").

What is claimed is:

1. A polycrystalline diamond compact, comprising:
   a substrate; and
   a polycrystalline diamond table bonded to the substrate, the polycrystalline diamond table including a plurality of diamond grains exhibiting diamond-to-diamond bonding therebetween, the plurality of diamond grains including:
   a first amount being about 35 volume % to about 45 volume % of the plurality of diamond grains, the first amount exhibiting a first average grain size of about 8 μm to about 14 μm; and
   a second amount being about 55 volume % to about 65 volume % of the plurality of diamond grains, the second amount exhibiting a second average grain size that is greater than the first average grain size and is about 15 μm to about 50 μm.

2. The polycrystalline diamond compact of claim 1 wherein the first average grain size is about 10 μm to about 12 μm and the second average grain size is about 18 μm to about 22 μm.

3. The polycrystalline diamond compact of claim 1 wherein the first amount is about 38 volume % to about 42 volume % and the second amount is about 58 volume % to about 62 volume %.

4. The polycrystalline diamond compact of claim 3 wherein the first average grain size is about 10 μm to about 12 μm and the second average grain size is about 18 μm to about 22 μm.

5. The polycrystalline diamond compact of claim 1 wherein the polycrystalline diamond table includes boron in a range from greater than 0 weight % to about 5 weight %.

6. The polycrystalline diamond compact of claim 5 wherein the range is from greater than 0 weight % to about 0.2 weight %.

7. The polycrystalline diamond compact of claim 1 wherein the polycrystalline diamond table is integrally formed with the substrate.

8. The polycrystalline diamond compact of claim 1 wherein the polycrystalline diamond table includes at least one exterior surface and a leached region extending inwardly from of the at least one exterior surface to a depth of greater than 250 μm.

9. A rotary drill bit, comprising:
   a bit body including a leading end structure configured to facilitate drilling a subterranean formation and having one or more blades; and
   a plurality of cutting elements mounted to the one or more blades, at least one of the plurality of cutting elements including:
   a substrate; and
   a polycrystalline diamond table bonded to the substrate, the polycrystalline diamond table including a plurality of diamond grains exhibiting diamond-to-diamond bonding therebetween, the plurality of diamond grains including:
   a first amount exhibiting a first average grain size of about 8 μm to about 14 μm; and
   a second amount exhibiting a second average grain size that is greater than the first average grain size and is about 15 μm to about 50 μm;
   wherein the first amount is about 35 volume % to about 45 volume % and the second amount is about 55 volume % to about 65 volume %; or the first amount is about 55 volume % to about 65 volume % and the second amount is about 35 volume % to about 45 volume %.

10. A polycrystalline diamond compact, comprising:
   a substrate; and
   a polycrystalline diamond table bonded to the substrate, the polycrystalline diamond table including a plurality of diamond grains exhibiting diamond-to-diamond bonding therebetween, the plurality of diamond grains including:

a first amount being about 55 volume % to about 65 volume % of the plurality of diamond grains, the first amount exhibiting a first average grain size of about 8 μm to about 14 μm; and a second amount being about 35 volume % to about 45 volume % of the plurality of diamond grains, the second amount exhibiting a second average grain size that is greater than the first average grain size and is about 20 μm to about 40 μm;

wherein a ratio of the first average grain size to the second average grain size is about 0.3 to about 0.7.

11. A polycrystalline diamond compact, comprising:

a substrate; and a polycrystalline diamond table bonded to the substrate, the polycrystalline diamond table including a plurality of diamond grains exhibiting diamond-to-diamond bonding therebetween, the plurality of diamond grains including:

a first amount being about 55 volume % to about 65 volume % of the plurality of diamond grains, the first amount exhibiting a first average grain size of about 8 μm to about 14 μm; and a second amount being about 35 volume % to about 45 volume % of the plurality of diamond grains, the second amount exhibiting a second average grain size that is greater than the first average grain size and is about 15 μm to about 50 μm.

12. The polycrystalline diamond compact of claim 11 wherein the first average grain size is about 10 μm to about 12 μm and the second average grain size is about 18 μm to about 22 μm.

13. The polycrystalline diamond compact of claim 11 wherein the first amount is about 58 volume % to about 62 volume % and the second amount is about 38 volume % to about 42 volume %.

14. The polycrystalline diamond compact of claim 13 wherein the first average grain size is about 10 μm to about 12 μm and the second average grain size is about 18 μm to about 22 μm.

15. The polycrystalline diamond compact of claim 11 wherein the first amount is about 60 volume % and the second amount is about 40 volume %, and wherein the first average grain size is about 12 μm and the second average grain size is about 20 μm.

16. The polycrystalline diamond compact of claim 11 wherein the polycrystalline diamond table includes boron in an amount from greater than 0 weight % to about 5 weight %.

17. The polycrystalline diamond compact of claim 16 wherein the amount is from greater than 0 weight % to about 0.2 weight %.

18. The polycrystalline diamond compact of claim 11 wherein the polycrystalline diamond table is integrally formed with the substrate.

19. The polycrystalline diamond compact of claim 11 wherein the polycrystalline diamond table includes at least one exterior surface and a leached region extending inwardly from of the at least one exterior surface to a depth of greater than 250 μm.

* * * * *